US011308256B2

(12) United States Patent
Wang et al.

(10) Patent No.: US 11,308,256 B2
(45) Date of Patent: Apr. 19, 2022

(54) METHOD OF POST OPTICAL PROXIMITY CORRECTION (OPC) PRINTING VERIFICATION BY MACHINE LEARNING

(71) Applicant: TAIWAN SEMICONDUCTOR MANUFACTURING CO., LTD., Hsinchu (TW)

(72) Inventors: Hung-Chun Wang, Taichung (TW); Cheng Kun Tsai, Hsinchu (TW); Wen-Chun Huang, Tainan (TW); Wei-Chen Chien, Hsinchu (TW); Chi-Ping Liu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/907,767

(22) Filed: Jun. 22, 2020

(65) Prior Publication Data

US 2020/0320246 A1     Oct. 8, 2020

Related U.S. Application Data

(63) Continuation of application No. 15/812,826, filed on Nov. 14, 2017, now Pat. No. 10,691,864.

(51) Int. Cl.
*G06F 7/50* (2006.01)
*G06F 30/398* (2020.01)
*G03F 1/36* (2012.01)
*G06F 30/20* (2020.01)

(52) U.S. Cl.
CPC .............. *G06F 30/398* (2020.01); *G03F 1/36* (2013.01); *G06F 30/20* (2020.01)

(58) Field of Classification Search
USPC .................................. 716/51, 52, 53, 54, 55
See application file for complete search history.

(56) References Cited

U.S. PATENT DOCUMENTS

| 10,386,714 B2 | 8/2019 | Kohli et al. |
| 2015/0324963 A1 | 11/2015 | Sezginer et al. |
| 2016/0162626 A1* | 6/2016 | Herrmann ........... G03F 7/70641 |
| | | 716/51 |
| 2017/0293219 A1* | 10/2017 | Yun ....................... G06F 30/398 |

(Continued)

OTHER PUBLICATIONS

Non-Final Office Action issued in U.S. Appl. No. 15/812,826, dated May 30, 2019.

(Continued)

*Primary Examiner* — Brian Ngo
(74) *Attorney, Agent, or Firm* — McDermott Will & Emery LLP

(57) ABSTRACT

Implementations of the disclosure provide a method of fabricating an integrated circuit (IC). The method includes receiving an IC design layout; performing optical proximity correction (OPC) process to the IC design layout to produce a corrected IC design layout; and verifying the corrected IC design layout using a machine learning algorithm. The post OPC verification includes using the machine learning algorithm to identify one or more features of the corrected IC design layout; comparing the one or more identified features to a database comprising a plurality of features; and verifying the corrected IC design layout based on labels in the database associated with the plurality of features.

20 Claims, 6 Drawing Sheets

(56) References Cited

U.S. PATENT DOCUMENTS

| | | | |
|---|---|---|---|
| 2017/0309008 A1* | 10/2017 | Shi | G03F 7/705 |
| 2018/0196340 A1* | 7/2018 | Kohli | G03F 1/36 |
| 2018/0203342 A1* | 7/2018 | Du | G03F 7/70308 |
| 2018/0218096 A1* | 8/2018 | Yu | G06F 30/398 |
| 2018/0300434 A1* | 10/2018 | Hu | G03F 7/70508 |
| 2018/0307792 A1* | 10/2018 | Kim | G06N 3/088 |
| 2018/0322234 A1* | 11/2018 | Cao | G06F 30/398 |
| 2019/0072847 A1* | 3/2019 | Kuo | G03F 7/2026 |
| 2019/0147127 A1* | 5/2019 | Su | G03F 7/70525 703/7 |

OTHER PUBLICATIONS

Non-Final Office Action issued in U.S. Appl. No. 15/812,826, dated Nov. 8, 2019.
Notice of Allowance ssued in U.S. Appl. No. 15/812,826, dated Feb. 21, 2020.

* cited by examiner

METHOD OF POST OPTICAL PROXIMITY CORRECTION (OPC) PRINTING VERIFICATION BY MACHINE LEARNING

RELATED APPLICATION

This application is Continuation of U.S. patent application Ser. No. 15/812,826, filed on Nov. 14, 2017, the entire contents of which are incorporated herein by reference.

BACKGROUND

Semiconductor devices are used in a variety of electronic applications, such as personal computers, cell phones, digital cameras, and other electronic equipment. Integrated circuits (ICs) are made by a process that includes a design step and a subsequent fabrication step. During the design step, a layout of an IC is generated as an electronic file. The layout includes geometric shapes corresponding to structures to be fabricated on-chip. During the fabrication step, the layout is formed onto a semiconductor workpiece, for example, by sequentially depositing insulating or dielectric layers, conductive layers, and semiconductive layers of material over a semiconductor substrate, and patterning the various material layers using lithography to form circuit components and elements thereon.

As the semiconductor industry has progressed into nanometer technology process nodes, such as 5 nm nodes, in pursuit of higher device density, higher performance, and lower costs. The ever-shrinking geometry size brings challenges to IC fabrication. There is a need to improve efficiency and reduce cost for various semiconductor processing steps, such as for printing verification after optical proximity correction (OPC).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
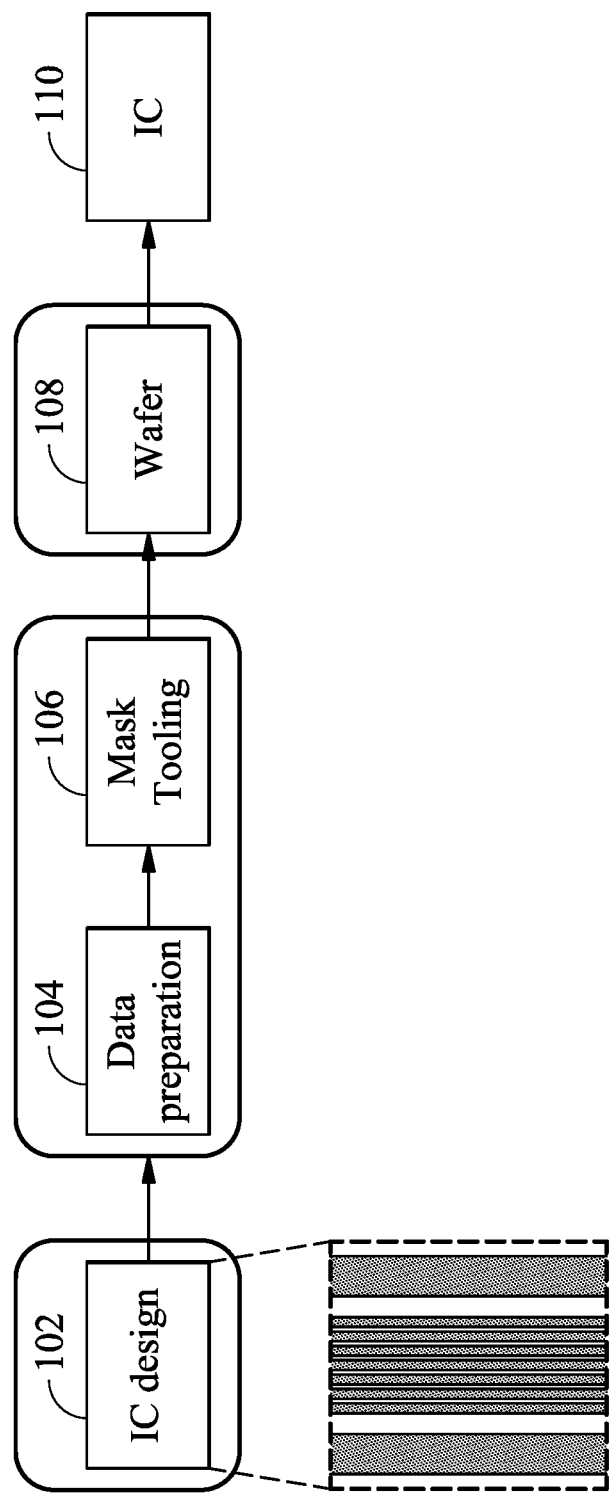
FIG. 1 is a block diagram illustrating an integrated circuit (IC) fabrication flow, in accordance with some embodiments.

The following disclosure provides many different implementations, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include implementations in which the first and second features are formed in direct contact, and may also include implementations in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various implementations and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the semiconductor industry, an integrated circuit (IC) design is formed on a wafer using various fabrication processes, such as etching, deposition, implantation, annealing polishing and lithography. A lithography process transfers a pattern from a photomask to the wafer such that etching, implantation or other steps are applied only to predefined regions of the wafer. The photomask includes an IC pattern and is used (sometimes repeatedly) in wafer fabrication. The photomask can be patterned using various lithography writing techniques. One example is electron beam (e-beam) writing.

The manufacturing of ICs uses lithography simulation to predict the image of the photomask created on the wafer. Such predictions can be used for example to assess the quality of the images, to verify the manufacturability of such images, to perform corrections of the photomask pattern using OPC to achieve images close to the targets, to optimize the printing parameters such as the illumination source, or globally optimize the source and the photomask to achieve better printability. The evaluation of the mask design can include identifying "hotspots", which are areas of the photomask that have defects at tape-out. An IC layout contour can be generated based on the IC design layout and other design data, such as a gate electrode and an active region. The generation of an IC layout contour is a process to simulate the IC device to generate its physical dimensions and geometries based on its design layout. The simulation can take into account manufacturing data associated with an IC manufacturer to be implemented to fabricate the IC device such as, for example, lithography processing data (e.g., statistical data of focus and/or energy or exposure dose) and/or etching data (e.g., etchant characteristics) used to transfer to IC design layout defined in the photomask to an IC feature on a wafer. The simulation will generate virtual fabricated features corresponding to the IC design layout. In one example, the simulation can be performed by a suitable simulation tool such as the simulated program with integrated circuit emphasis (SPICE). SPICE is a tool to provide complete physical simulation including output signal deformation, signal level, and time delay. SPICE is a circuit-analysis program developed by UC Berkeley. The simulated results may include various electrical parameters, such as saturation current. In another embodiment, the simulated results include other electrical performance, such as short channel effect and the associated performance deviation. Various verification and inspection can be performed to identify hotspots that may cause quality issues and/or reliability issues to the IC device. In one example, various criteria are defined to check the simulated electrical parameters and to find from the simulated results if any area is out of the tolerable ranges (e.g., referred to as the process window) according to predefined criteria.

It is more challenging to form a photomask for ICs having smaller feature sizes. The proximity effect is a form of optical distortion associated with photoresist images. For a given development time, whether or not a given area of a photoresist layer will be left or removed after the development process depends on the total amount of energy deposited in that area during its exposure to radiation. Image features whose size and/or separation approach the resolution limit of said radiation will thus be subject to distortion that depends on how the diffraction maxima and minima, that lie on both sides of a 'sharp' edge, interact with one another. The proximity effect can be compensated for, at least in part, by modifying any given feature in the opposite direction to the expected distortion.

Optical proximity correction (OPC) is one lithography technique used to tune (e.g., correct or optimize) the mask layout design for improved imaging effect. The objective of the OPC process is to reproduce in the silicon wafer, as well as possible, the original layout drawn by the designer. For example, OPC can be used to compensate for image errors due to diffraction or process effects. OPC helps to maintain the edge placement integrity of the original mask layout design, after processing, into the etched image on the wafer. For example, after processing, the images etched on the wafer can appear with irregularities such as line widths that are narrower or wider than designed. OPC can compensate for such irregularities by changing (e.g., correcting) the pattern of the mask layout design. Changes made to the mask layout design may be referred to as assist features (AFs).

Other distortions, such as rounded corners, are driven by the resolution of the optical imaging tool and are harder to compensate for. Such distortions, if not corrected for, may significantly alter the electrical properties of what was being fabricated. OPC can correct these errors by moving edges or adding extra polygons to the mask layout design. This may be driven by pre-computed look-up tables based on width and spacing between features (e.g., known as rule based OPC) or by using compact models to dynamically simulate the final pattern and thereby drive the movement of edges, typically broken into sections, to find the best solution, (e.g., known as model based OPC).

After OPC is performed to make the adjustments to the mask layout design pattern, the modified pattern may be more irregular. Post OPC verification can be performed to identify highlight areas of the corrected mask layout design that may not properly print on the wafer.

Embodiments of the present disclosure provide techniques for post OPC verification using machine learning approaches. The OPC verification techniques provided herein may be used to verify (e.g., evaluate or predict) that a mask layout design, including assist features (AF) added in the OPC process, can be printed. The OPC and post OPC verification may be used in the tooling of a photomask to be used for IC fabrication for semiconductor devices.

According to embodiments provided in the present disclosure, described in more detail below, machine learning techniques (e.g., image based machine learning) can be used for data training and generation of database of mask layout design with various added AF and associated print-out risks and highlight points. The machine learning techniques may be used in the post OPC verification to identify features in the OPC-corrected mask layout design, match the features with mask layout designs in the database, and verify the OPC-corrected mask layout design based on the associated print-out risks and highlight points in the database.

FIG. 1 is a block diagram illustrating an integrated circuit (IC) fabrication flow 100, in accordance with some embodiments of the present disclosure. The IC fabrication flow 100 is one example of an IC fabrication flow in which the post OPC verification techniques using machine learning approaches (e.g., image based machine learning) can be used.

The IC fabrication flow 100 circuit fabrication can begin with IC design 102 to create the mask layout design. The IC design 102 can be implemented by a design house according to one embodiment. In another example, the designer is a design team separated from a semiconductor manufacturer assigned for making IC products according to the IC design 102. In various embodiments, the semiconductor manufacturer is capable of making photomasks, semiconductor wafers, or both. The IC design 102 includes various geometrical patterns designed for an IC product and based on the specification of an IC product. The IC design 102 can be based on a design specification and may include logic design, schematic design and physical design. As an example, a portion of the IC design layout includes various IC features (also referred to as main features), such as active region, gate electrode, source and drain, metal lines or via of the interlayer interconnection, and openings for bonding pads, to be formed in a semiconductor substrate (such as a silicon wafer) and various material layers disposed over the semiconductor substrate. The IC design layout may include certain assist features (AF), such as those features for imaging effect, processing enhancement, and/or mask identification information. The IC design 102 depicted in FIG. 1 is merely one illustrative example of mask layout design having geometric patterns.

The IC design 102 generates the mask layout design for the IC, which is provided to a mask making entity, such as mask shop. The IC design layout may be presented in one or more data files having the information of the geometrical patterns. In one example, the IC design layout is expressed in a "gds" (graphics design system data) format. The mask making entity can perform data preparation 104 and mask tooling 106 from the mask layout design received from the design house. The mask tooling 106 fabricates the photomask (sometimes referred to as a reticle) or set of photomasks based on an adjusted mask layout design resulting from the data preparation 104. The data preparation 104 prepares the adjusted mask layout design and provides the pattern to the mask tooling 106. As described in more detail below with reference to FIG. 2, the data preparation 104 includes performing OPC and post-OPC verification. According to embodiments of the present disclosure, the post-OPC verification uses machine learning (e.g., image based machine learning) approaches to verify the corrected mask layout design before the mask tooling 106.

The mask tooling 106 fabricates the mask using lithography techniques, such as e-beam lithography. The mask tooling 106 can form the photomask according to various technologies. In another embodiment, the mask is formed using the binary technology. In this case, the mask pattern includes opaque regions and transparent regions. In one example, the binary mask includes a transparent substrate (e.g., fused quartz), and an opaque material (e.g., chromium) coated in the opaque regions of the mask. In another embodiment, the mask is formed using a phase shift technology. In the phase shift mask (PSM), various features in the pattern formed on the mask are configured to have proper phase difference to enhance the resolution and imaging quality. In various examples, the phase shift mask can be attenuated PSM, alternating PSM or chrome-less PSM known in the art or other phase shift masks to be developed in the future.

The mask (or set of masks) can be used by an IC fabrication entity (e.g., a semiconductor manufacturer sometimes referred to as a "fab") to fabricate semiconductor wafer 108. The semiconductor wafer 108 can include a silicon substrate or other proper substrate, which may be a semiconductor (e.g., germanium), semiconductor compound (e.g., silicon carbide, indium arsenide, or indium phosphide), or semiconductor alloy (e.g., silicon germanium carbide, gallium arsenic phosphide, or gallium indium phosphide). The semiconductor wafer may further include various doped regions, dielectric features, and multilevel interconnects.

The IC fabrication entity includes various fabrication tools to apply various fabrication processes to the semiconductor wafer 108 to fabricate an IC 110. The fabrication processes may include performing deposition, etching, polishing, cleaning, annealing and lithography on the wafer 108. The IC fabrication entity uses lithography to form an IC pattern on the semiconductor wafer 108 for the IC 110 using the mask created from the corrected mask layout design verified according to the techniques described herein using machine learning. The IC pattern is transferred from a photomask to a sensitive material layer (such as photoresist).

An exemplary lithography process may include processing steps of photoresist spin-on coating, soft baking, mask aligning, exposing, post-exposure baking, developing photoresist and hard baking. The lithography apparatus generally includes a radiation source to provide radiation energy, a lens system to project radiation energy for lithography patterning, and a mask stage having a scan function. The radiation source may be a suitable light source such as an ultra-violet (UV), deep ultra-violet (DUV), or extreme ultra-violet (EUV) source. For example, the radiation source may include, but is not limited to, a Krypton Fluoride (KrF) excimer laser, an Argon Fluoride (ArF) excimer laser, a Fluoride ($F_2$) excimer laser, a mercury lamp, or other light sources. The lens system may include one or more illumination modules designed to direct radiation beams from the radiation source onto a photomask. The mask stage is operable to secure the photomask and manipulate the photomask in transitional and/or rotational modes. The lithography apparatus may include a substrate stage for holding and manipulating a substrate to be patterned in transitional and/or rotational modes during the first lithography process. An alignment device can be used to align the photomask and the substrate.

In another example, the photomask is used to form a pattern over the semiconductor wafer 108 prior to an ion implantation process to form various doped regions in the semiconductor wafer 108. In another example, the photomask is used to form a pattern over the semiconductor wafer 108 prior to an etching process to form various etching regions in the semiconductor wafer 108. In another example, the photomask is used to form a pattern over the semiconductor wafer 108 prior to a deposition process, such as chemical vapor deposition (CVD) or physical vapor deposition (PVD), to form a thin film in various regions on the semiconductor wafer 108.

Figure 2:
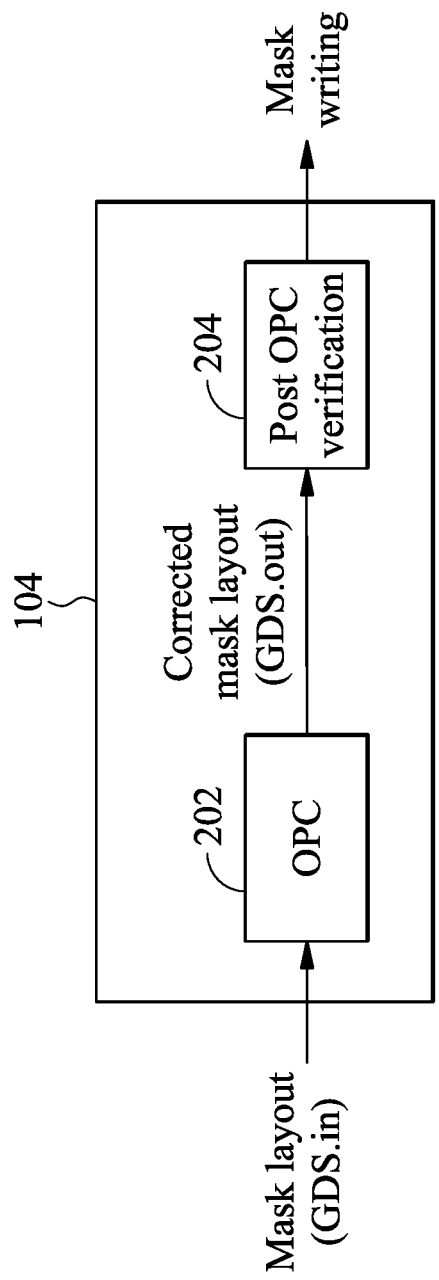
FIG. 2 is a block diagram illustrating an example flow for IC design and mask making for an IC fabrication, in accordance with some embodiments.

FIG. 2 is a block diagram illustrating a method for IC design and mask making for an IC fabrication, in accordance with some embodiments. As shown in FIG. 2, the data preparation 104 includes OPC 202 and post OPC verification 204. As shown in FIG. 2, the data preparation 104 receives the mask layout (e.g., from the design house), which may be the design pattern for the IC or semiconductor device.

Although not shown in FIG. 2, the data preparation 104 can include performing a logic operation (or LOP) to the IC design layout. For example, the logic operation may modify the IC design layout according to manufacturing rules.

Although not shown in FIG. 2, the data preparation 104 can include performing a retargeting process to the IC design layout. In this step, the IC design layout may be modified for improved imaging effect in a rule-based approach, such that the modified IC design layout has an improved image on a wafer. The modification to the IC design layout at this step may include resizing a main feature, repositioning an edge of the main feature, reshaping the main feature, adding an assist feature to the main feature, adding a scattering bar to the main feature, or a combination thereof. In one example, various assistant features include a serif feature or a dummy insertion feature. As noted above, a functional element in the integrated circuit is referred to as a main feature. In another example, a scattering bar is spaced away from the main features. In yet another example, a scattering bar is a sub-resolution feature, which has a dimension under the resolution of the lithography process. Thus, those sub-resolution features cannot be imaged on a semiconductor substrate. However, a dummy insertion feature is dimensioned to be imaged to a wafer. For example, the dummy insertion features include dummy isolation features and/or conductive features disposed away from the main features provide a uniform thermal effect during a thermal process. In another example, dummy insertion features may be added to the IC design layout for enhanced chemical mechanical polishing (CMP) or other processing advantages. Those features are referred to as resolution features. Additionally, the lithography imaging of the retargeted IC design layout is improved with enhanced resolution and precision. The retargeting process is not only used to incorporate various features but also modifying the main features for optical performance during a lithography process. Alternatively, other features may be added or other action may be applied to tune the IC design layout.

The data preparation 104 proceeds to the OPC 202 process. OPC 202 takes an input of an IC design layout (e.g., shown in FIG. 2 as mask layout (GDS.in)) and provides an output of another IC design layout (e.g., shown in FIG. 2 as corrected mask layout (GDS.out)) modified by the OPC process. OPC 202 may be performed using a model-based approach. During the OPC 202, the IC design layout is modified such that the modified IC design layout has an improved image on a wafer. The modification to the IC design layout at this step includes resizing a main feature, repositioning an edge of the main feature, reshaping the main feature, adding an assist feature to the main feature, adding a scattering bar to the main feature, or a combination thereof. OPC 202 includes simulating the IC design layout to generate a contour of the IC design layout. The contour of the IC design layout is an image of the IC design layout when it is transferred from the corresponding photomask to an IC substrate, such as a semiconductor wafer. Based on the difference of the contour and expected IC design layout, this process may be iterated many times until the difference is within a tolerable range. The simulation is based on the manufacturing data. The simulation includes simulating the lithography process to transfer the IC design layout from the photomask to the IC substrate according to manufacturing data that includes lithography optical imaging data and may further include resist reaction data. In another example, the manufacturing data may further include etch data such as etching bias.

Post OPC verification 204 can check the resist print-out according to the input designed layout patterns. Post OPC verification 204 may include an evaluation process performed to determine if the contour is acceptable. A set of e-beam data is generated that presents the IC design layout in a format accessible by the e-beam writer. The set of e-beam data may be referred to as tape-out for mask masking. A tape-out system may implement the data preparation 104. The tape-out system may be a separate entity or may be distributed in existing entities, such as a design/lab facility or an online system. The tape-out system may be connected to a network, such as the Internet or an intranet. As described below, aspects of the present disclosure provide machine learning approaches to post OPC verification 204.

In conventional post OPC verification (e.g., referred to as printing check), the print check can be performed by adjusting the simulated exposure energy dose. For example, the dose can be increased or decreased within a range near nominal conditions. Then the full chip examination is executed with the resultant model to evaluate the probability of print-out or defect. However, in some cases, the dose variation window depends on layer types. Therefore, a range of dose bias might not be accurate enough to check the exact region of print out, which leads to underestimation or overestimation of the hot spot regions (e.g., regions with a probability of defect in printing) during the examination, which can reduce yield. Accordingly, more accurate post OPC verification techniques are desirable.

Example Post-OPC Verification by Machine Learning

As mentioned above, OPC processes provide an image of the IC design layout when it is transferred from the corresponding photomask to an IC substrate, such as a semiconductor wafer. Machine learning is a powerful approach to pattern recognition. According to certain aspects, machine learning can be used for checking the resist print-out in post OPC verification using a trained model of pattern recognition to build the relationship between the OPC corrected IC design layout (e.g., main pattern and neighboring AF) and the associated evaluation of whether the wafer will print out or not for that pattern. Examples of machine learning algorithms include convolutional neural network algorithm, a recursive neural network algorithm, a support vector machine algorithm, and a deep learning artificial intelligence algorithm.

In machine learning, a convolutional neural network (CNN, or ConvNet) is a class of deep, feed-forward artificial neural network that have successfully been applied to analyzing visual imagery. CNNs use a variation of multilayer perceptrons designed to require minimal preprocessing. They are also known as shift invariant or space invariant artificial neural networks (SIANN), based on their shared-weights architecture and translation invariance characteristics. CNNs use relatively little pre-processing compared to other image classification algorithms. This means that the network learns the filters that in traditional algorithms were hand-engineered. This independence from prior knowledge and human effort in feature design is a major advantage.

A recursive neural network (RNN) is a kind of deep neural network created by applying the same set of weights recursively over a structure, to produce a structured prediction over variable-size input structures, or a scalar prediction on it, by traversing a given structure in topological order. RNNs have been successful for instance in learning sequence and tree structures in natural language processing, mainly phrase and sentence continuous representations based on word embedding. RNNs have first been introduced to learn distributed representations of structure, such as logical terms.

In machine learning, support vector machines (SVMs, also support vector networks) are supervised learning models with associated learning algorithms that analyze data used for classification and regression analysis. Given a set of training examples, each marked as belonging to one or the other of two categories, an SVM training algorithm builds a model that assigns new examples to one category or the other, making it a non-probabilistic binary linear classifier (although methods such as Platt scaling exist to use SVM in a probabilistic classification setting). An SVM model is a representation of the examples as points in space, mapped so that the examples of the separate categories are divided by a clear gap that is as wide as possible. New examples are then mapped into that same space and predicted to belong to a category based on which side of the gap they fall. In addition to performing linear classification, SVMs can efficiently perform a non-linear classification using what is called the kernel trick, implicitly mapping their inputs into high-dimensional feature spaces. When data are not labeled, supervised learning is not possible, and an unsupervised learning approach is required, which attempts to find natural clustering of the data to groups, and then map new data to these formed groups. The clustering algorithm which provides an improvement to the support vector machines is called support vector clustering and is used when data are not labeled or when only some data are labeled as a preprocessing for a classification pass.

Deep learning (also known as deep structured learning or hierarchical learning) is the application of artificial neural networks (ANNs) to learning tasks that contain more than one hidden layer. Deep learning is part of a broader family of machine learning methods based on learning data representations, as opposed to task-specific algorithms. Learning can be supervised, partially supervised or unsupervised. Some representations are loosely based on interpretation of information processing and communication patterns in a biological nervous system, such as neural coding that attempts to define a relationship between various stimuli and associated neuronal responses in the brain.

Figure 3:
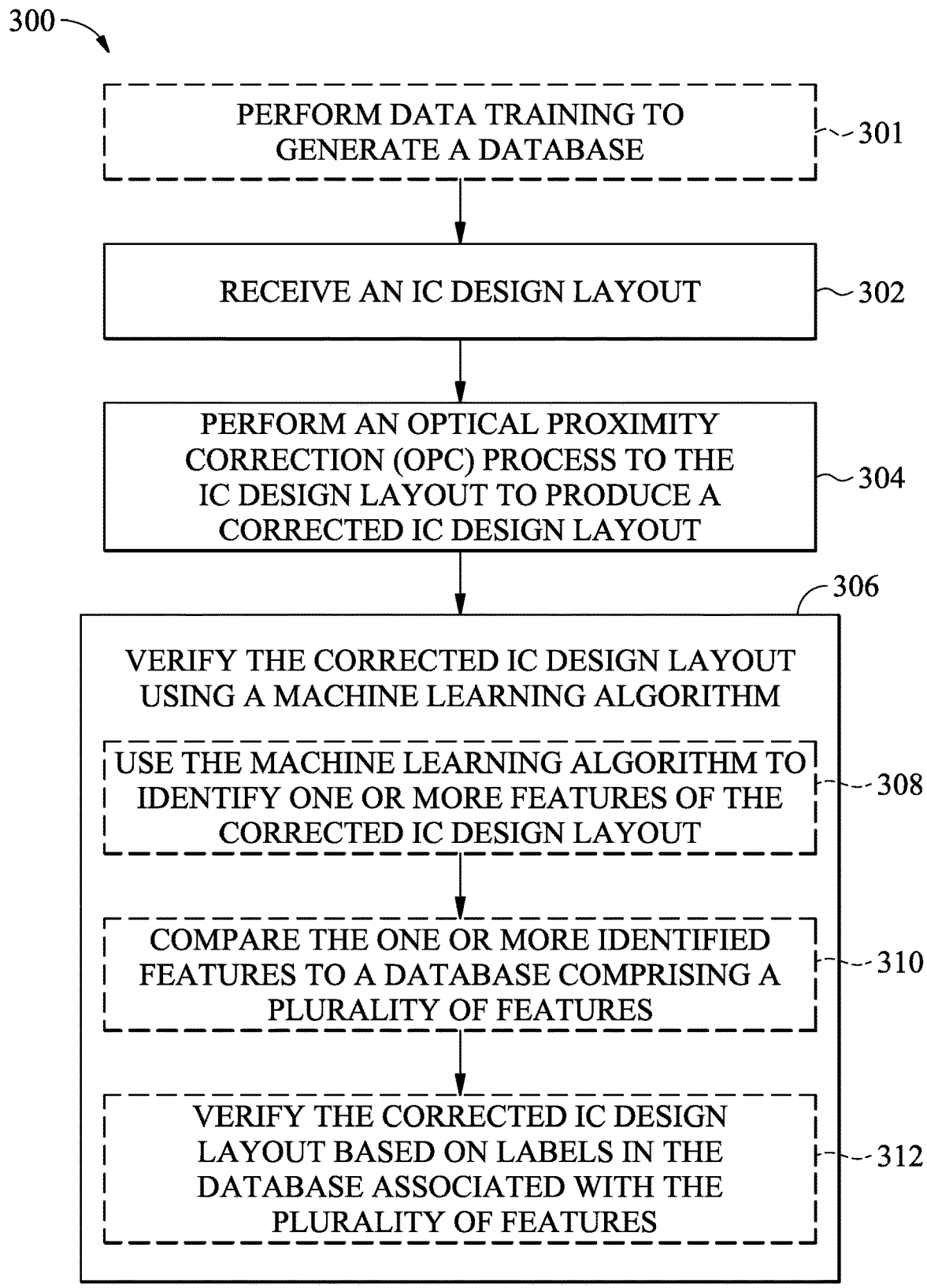
FIG. 3 is a flow diagram illustrating example operations for post optical proximity correction (OPC) verification using machine learning, in accordance with some embodiments.

FIG. 3 is a flow diagram illustrating example operations 300 for post OPC verification using machine learning (e.g., image based machine learning), in accordance with some embodiments. According to certain aspects, operations 300 for post OPC verification may be performed by a mask making entity (e.g., by a data preparation module) as described above. In aspects, operations 300 may be performed by a processor or processing system. For clarity, operations 300 are described in conjunction with the system 400 illustrated in FIG. 4, which may be configured to perform the operations 300.

Operations 300 may begin, at 302, by receiving an IC design layout (e.g., a gds.in data clip or other computer assisted design (CAD) data file). The IC design layout may be received by the masking making module 404. The IC design layout may be output from the IC design module 402 (e.g., such as a design house). The IC design layout may be generated automatically or input by a user using CAD software, for example.

Operations 300 includes performing an OPC process to the IC design layout to produce a corrected IC design layout, at 304, and verifying the corrected IC design layout using a machine learning algorithm, at 306. The mask making module 404 may include a data preparation module 406 that performs the OPC and post OPC verification. For example, data preparation module 406 includes OPC module 408 that performs an OPC process to output a corrected mask layout design (e.g., gds.out data clip) to the post OPC verification module 410.

According to certain aspects, verifying the corrected IC design layout at 306 includes using the machine learning algorithm to identify one or more features (e.g., main features and/or AFs) of the corrected IC design layout at 308, comparing the one or more identified features to a database comprising a plurality of features at 310, and verifying the corrected IC design layout based on labels (e.g., that indicates whether, or a probability, the IC design will print-out on the wafer successfully or with defects) in the database associated with the plurality of features at 312. For example, the post OPC verification module 410 includes the feature recognition module 412 configured to identify features in the corrected IC design layout.

According to certain aspects, the feature recognition module 412 uses machine learning algorithms to identify the features. A machine-learning print-out model is trained with simulation/wafer results for various input pattern layouts. Through a machine learning approach, such as convolution neural network, support vector machine, deep learning method, the specific features coming from the input gds layout can be extracted and embedded in the trained model. The model then builds the correlation between possible printing out results on wafer and input designed pattern with AF placement. For example, the post OPC verification module 410 further includes database comparison module 414. System 400 can include a memory 418 (or multiple memories), which may be located at various places within the system 400. Memory 418 stores a database 420. Database 420 may include many different IC design layouts, features, and/or AFs. In addition, database 420 stores labels associated with each of the different ID design layout, features, and/or AFs in the database. The labels correspond to predictions (e.g., simulated results) of whether the pattern will print-out successfully on a wafer or have defects (e.g., during a manufacturing lithography process using the mask to fabricate an IC). The database comparison module 414 may compare the features identified in the corrected IC design layout to features in the database 420. Based on the comparison, the database comparison module 414 can match the corrected IC design to a pattern in the database 420. Evaluation module 416 can check the label associated with the matched patterns in the database 420. Based on the label, the evaluation module 416 can determine (e.g., predict) whether the corrected IC design layout will print-out.

Thus, the machine learning trained model can highlight the possible pattern region and more detailed process window (e.g., tolerance threshold) model can be applied to check the real process window. The process window can be pre-checked and gated after OPC flow immediately and the overall run time of semiconductor development can be reduced.

With the machine learning, the system 400 can train an accurate printing model from numerous rigorous simulation results. In addition, from a machine technique (e.g., such as neural network), the model then can build the connection between the design-on-mask (DOM) and the design-on-wafer (DOW) based on the pattern layout, for example within a certain ambit. The resultant model can then be applied at post OPC to check the print-out probability efficiently since the proposed method is image based rather than a real time simulation.

As shown in FIG. 3, at step 301, the data training can be performed to generate the database 420, for example, by data training module 422. For example, data training module 422 can include pattern generation module 424 that generates many different patterns (e.g., IC design layouts, features, AFs, AF placement, layout types, environments, etc.). The training simulation module 426 can perform a printing simulation for the patterns generated by the pattern generation module 424 to determine a probability of whether the pattern will print-out successfully on a wafer or print with defects on the wafer. Based on the results of the simulation, the training simulation module 426 can create a label associated with the pattern to be stored in the database 420. These stored patterns and labels may be used later in the post OPC verification process.

In some cases, the simulation performs the OPC compact model to determine print-out risks. In this model, the exposure energy changes to test the pattern at various environments to determine whether the pattern will print-out successfully or not (e.g., with defects). For example, the OPC compact model may have the form:

$$\sum_i cifi(x) = c1f1(x) + c2f2(x) + \ldots + cnfn(x) + \text{threshold}$$

Figure 4:
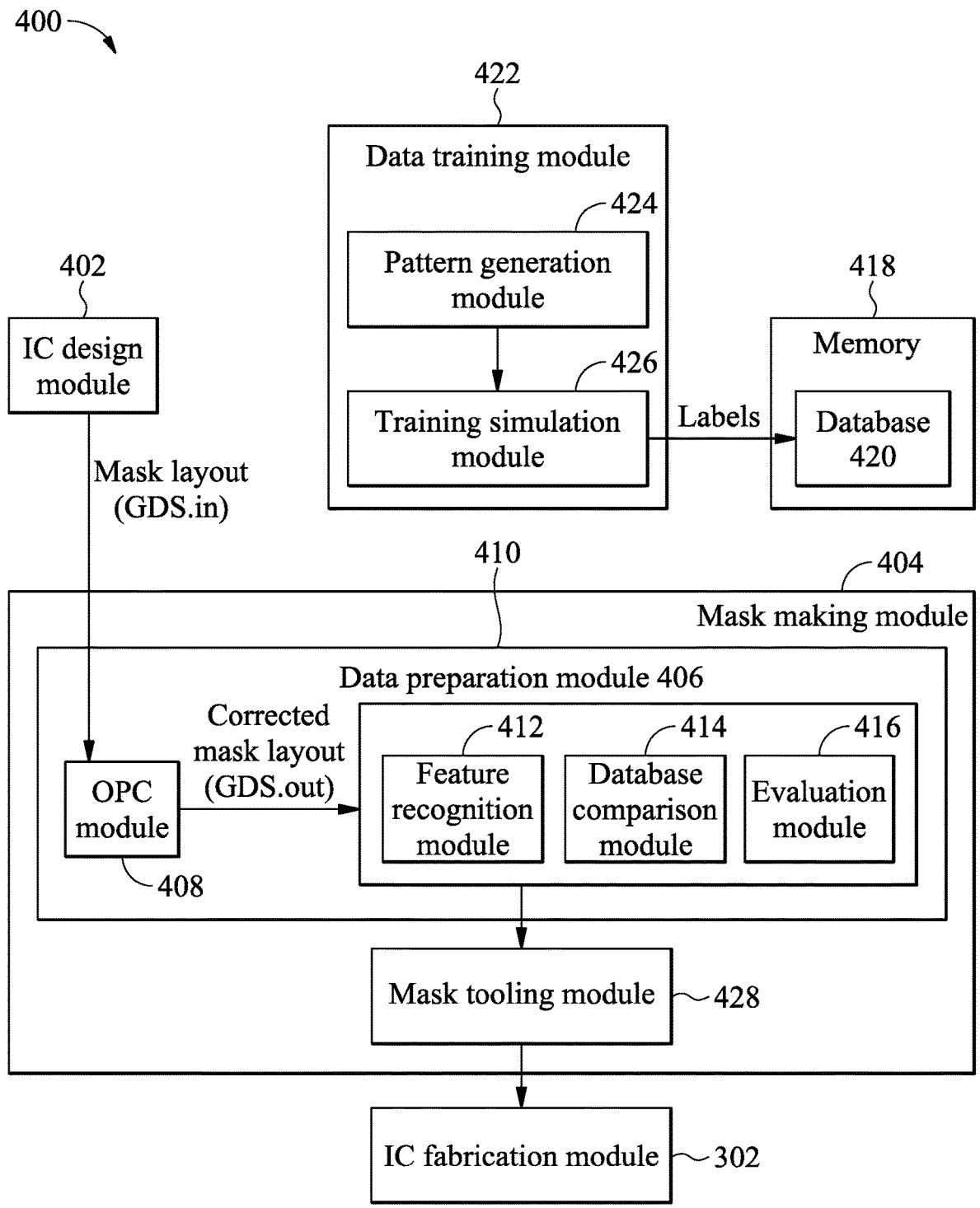
FIG. 4 is a block diagram illustrating an example system in which aspects of the present disclosure are implemented for IC design and mask making, using machine learning for post OPC verification, for an IC fabrication, in accordance with some embodiments.
Figure 4A:
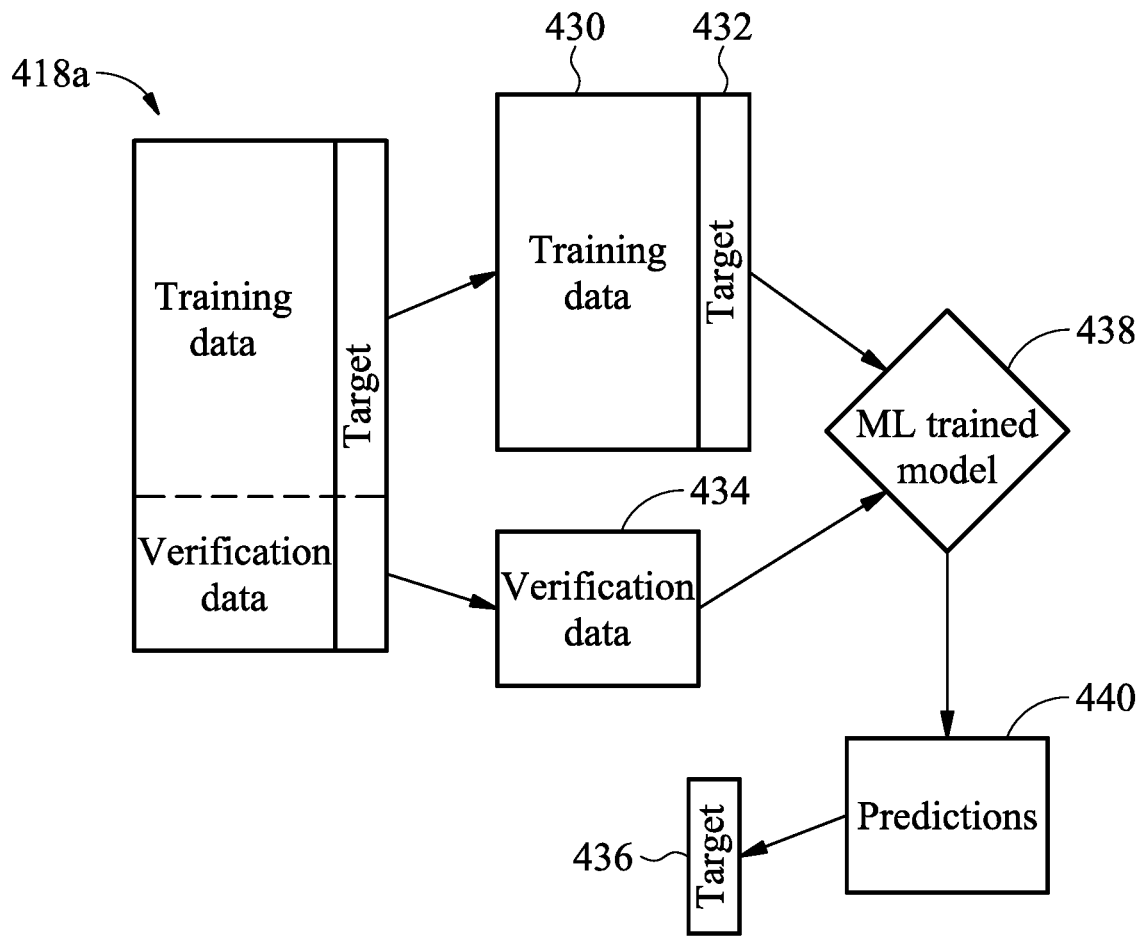
FIG. 4A is a block diagram illustrating example data resource usage for machine learning model training and verification, in accordance with some embodiments.

According to certain aspects, the machine learning approach to post OPC verification described herein can be used in addition to other OPC verification techniques, such as the compact OPC model. For example, the corrected IC design layout can be verified by performing simulations at different exposure doses to determine the print-out probability based on contour and intensity. Thus, multiple criteria can be applied to check the print-out risk using different approaches. According to certain aspects, around eighty percent (80%) of the available data can be used for the data training to generate the database 420, and around twenty percent (20%) of the data can be used for the printing verification as shown in FIG. 4A. As shown in FIG. 4A, the data resources 418a (e.g., in memory 418) can split into subsets of resources for data training and resources for verification (testing), which may include features and the target pattern. The data resources can be randomly selected. As shown in FIG. 4A, around 80% of the data resources 418a may be selected for verification data 430 and target data 432 and around 20% of the data resources 418a may be selected for verification data 434 and target data 436. This may avoid over-fitting during model training. Data training and verification can be performed multiple times using different sets of data to train and verify the machine learning (ML) model 438. The verification data 438 includes testing predictions 440 for features in the training data 430 based on the ML model 438. The testing predictions 440 may be compared to the target data 436 to assess the accuracy of ML model 438.

Once the IC design layout is verified, the photomask can then be printed (e.g., tape-out). As shown in FIG. 4, the mask making module 404 include mask tooling module 428. The mask tooling module 428 uses the IC mask layout design verified by the data preparation module 406 and prints the mask (e.g., using an e-beam lithography or other fabrication technique). The mask can then be used for fabrication of the IC for a semiconductor device. As shown in FIG. 4, system 400 includes IC fabrication module 430. IC fabrication module 430 can be implemented by a semiconductor manufacturing entity (e.g., fab). IC fabrication module 430 can apply various lithography techniques using the mask to fabricate an IC.

Figure 5:
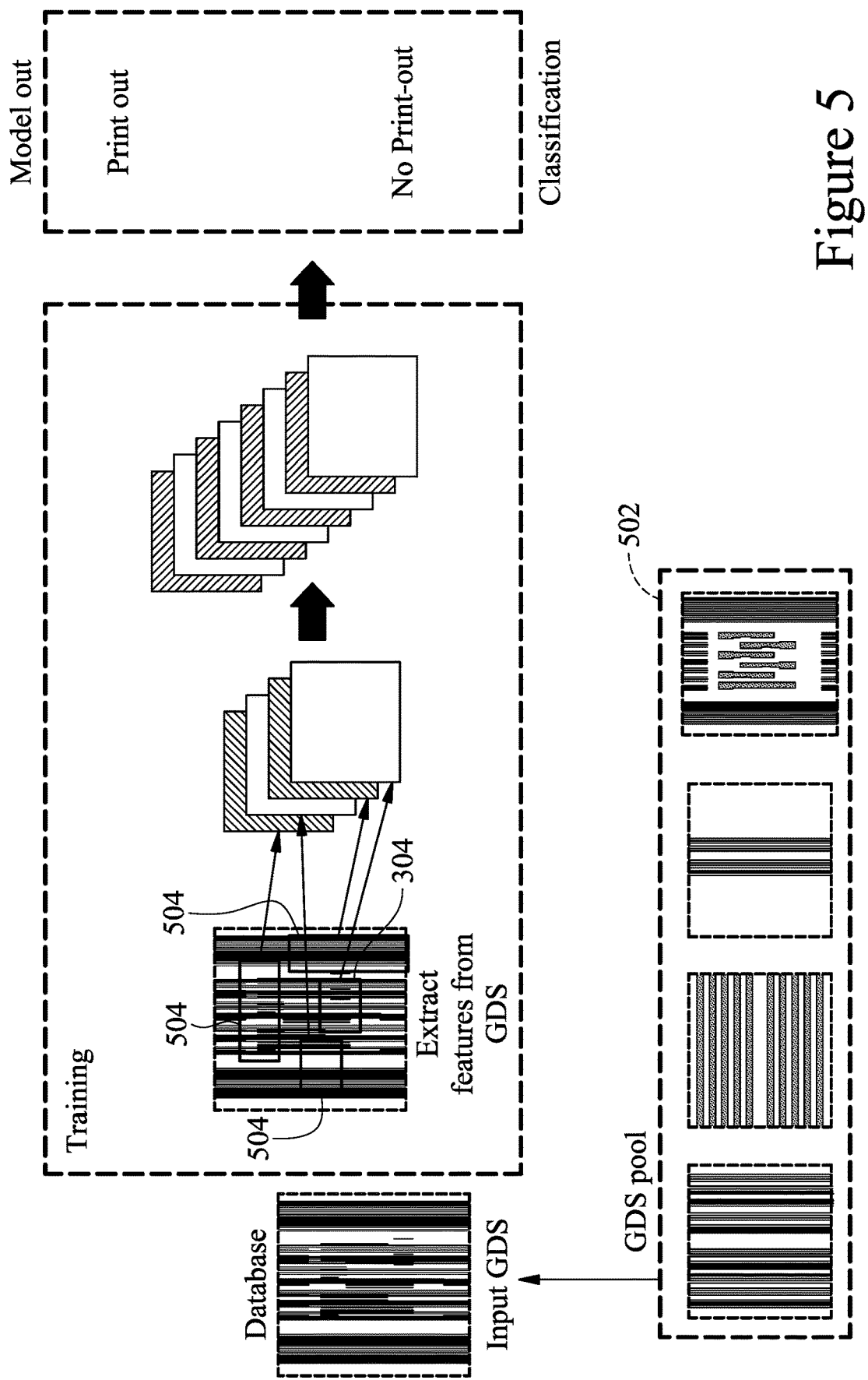
FIG. 5 is a block diagram illustrating data training, feature extraction, and database generation machine learning techniques for post OPC verification, in accordance with some embodiments.

FIG. 5 is a block diagram illustrating data training, feature extraction, and database generation machine learning techniques for post OPC verification, in accordance with some embodiments. FIG. 5 illustrates in more detail the data training and database generation techniques, for example, that can be performed by the data training module 422.

As shown in FIG. 5, the data training may include forming a GDS pool 502. For example, the GDS pool 502 can include IC design layouts (e.g., gds clips) generated by the pattern generation module 424 and stored in database 420. As shown in Figures, features (e.g., main features, AFs, etc.) can be extracted from the IC design layouts, such as features 504. As described above, machine learning techniques can be used for the feature extraction. The training simulation module 426 can predict whether the features will "print-out" or "no print-out". The output of the training is a label associated with the features/patterns that can be stored in the database 420 to indicate whether the associated feature/pattern will print-out. As described above, the patterns and labels stored in the database 420 can be used for post OPC verification.

The various illustrative logical blocks, modules and circuits described in connection with the present disclosure may be implemented or performed with a general purpose processor, an application specific integrated circuit (ASIC), a field programmable gate array (FPGA) or other programmable logic device (PLD), discrete gate or transistor logic, discrete hardware components, or any combination thereof designed to perform the functions described herein. If implemented in software, the functions may be stored or transmitted over as one or more instructions or code on a computer readable medium. Software shall be construed broadly to mean instructions, data, or any combination thereof, whether referred to as software, firmware, middleware, microcode, hardware description language, or otherwise. Computer-readable media include both computer storage media and communication media including any medium that facilitates transfer of a computer program from one place to another. A processor may be responsible for the execution of software modules stored on the machine-readable storage media. A computer-readable storage medium may be coupled to a processor such that the processor can read information from, and write information to, the storage medium. In the alternative, the storage medium may be integral to the processor. The machine-readable media may include a computer readable storage medium with instructions stored thereon. The machine-readable media, or any portion thereof, may be integrated into the processor, such as the case may be with cache and/or general register files. The machine-readable media may be embodied in a computer-program product.

The computer-readable media may comprise a number of software modules. A software module may comprise a single instruction, or many instructions, and may be distributed over several different code segments, among different programs, and across multiple storage media. The software modules include instructions that, when executed by an apparatus such as a processor, cause the processing system to perform various functions. Thus, certain aspects may comprise a computer-readable medium having instructions stored (and/or encoded) thereon, the instructions being executable by one or more processors to perform the operations described herein, for example, instructions for performing the operations described herein and illustrated in FIG. 3.

Techniques described herein for using machine learning for post OPC verification of the IC design layout can help to improve the efficiency and accuracy of verifying the IC design layout. Improving the efficiency can speed of the manufacturing process of mask and in turn, reduce associated costs. Improving the accuracy can reduce defects in printed masks, which in turn, reduces time and costs involved in correcting or reprinting the defective mask.

In an embodiment a method of fabricating an IC is provided. The method includes receiving an integrated circuit (IC) design layout. The method includes performing an optical proximity correction (OPC) process to the IC design layout to produce a corrected IC design layout. The method further includes verifying the corrected IC design layout using a machine learning algorithm.

In another embodiment, a system of fabricating an IC is provided. The system generally includes a mask making module configured to receive an IC design layout. The mask making module includes a data preparation module configured to perform an OPC process to the IC design layout to produce a corrected IC design layout and verify the corrected IC design layout using a machine learning algorithm. The system includes a mask tooling module configured to print the mask layout design. The system includes a fabrication module configured to fabricate the IC using the mask.

In another embodiment, a computer readable medium storing computer executable code is provided. The computer executable code includes code for receiving an IC design layout. The computer executable code includes code for performing an OPC process to the IC design layout to produce a corrected IC design layout. The computer executable code includes code for verifying the corrected IC design layout using a machine learning algorithm.

The foregoing outlines features of several implementations so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the implementations introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method of fabricating an integrated circuit (IC), comprising:
   receiving an IC design layout;

performing an optical proximity correction (OPC) process to the IC design layout to produce a corrected IC design layout;

verifying the corrected IC design layout using a machine learning algorithm to identify and compare one or more features of the corrected IC design layout with a database comprising a plurality of features;

verifying the corrected IC design layout based on labels in the database associated with the plurality of features; and verifying the corrected IC design layout using a compact OPC model by performing a plurality of printing simulations for each IC, wherein in verifying using the compact OPC model, an exposure energy changes to determine whether a pattern will print-out successfully or not, and wherein the compact OPC models comprises following expression:

$$\sum_i c_i f_i(x) = c1 f1(x) + c2 f2(x) + \ldots + cn fn(x) + \text{threshold}.$$

2. The method of claim 1, further comprising:
generating the database, wherein generating the database comprises:
  generating a plurality of IC design layouts, and
  simulating each of the plurality of IC design layouts to determine a probability of whether the corrected IC design will print-out successfully on a wafer or print with defects on the wafer.

3. The method of claim 2, wherein generating the database further comprises:
  storing a label associated with each of the simulated IC design layouts in the database, wherein the label indicates the probability of whether the corrected IC design will print-out successfully on a wafer or print with defects on the wafer.

4. The method of claim 3, wherein the labels correspond to a probability of whether the corrected IC design will print-out successfully on a wafer or print with defects on the wafer.

5. The method of claim 4, wherein performing the plurality of printing simulations for each IC occurs at a plurality of exposure doses to determine the probability in verification of the corrected IC design layout.

6. The method of claim 1, wherein receiving the IC design layout comprises receiving a graphic design system (GDS) file, and wherein the corrected IC design layout comprises an adjusted GDS file.

7. The method of claim 1, wherein the machine learning algorithm comprises at least one of: a convolutional neural network algorithm, a recursive neural network algorithm, a support vector machine algorithm, or a deep learning artificial intelligence algorithm.

8. The method of claim 1, further comprising manufacturing a mask using the verified corrected IC design layout.

9. The method of claim 1, wherein the method is performed by a computer system.

10. A system of fabricating an integrated circuit (IC), comprising:
at least one memory storing a database;
a mask making module configured to receive an IC design layout, wherein the mask making module comprises:
  a data preparation module configured to:
    perform an optical proximity correction (OPC) process to the IC design layout to produce a corrected IC design layout, and
    verify the corrected IC design layout using a machine learning algorithm to identify and compare one or more features of the corrected IC design layout with the database comprising a plurality of features, and
    verify the corrected IC design layout based on labels in the database associated with the plurality of features;
a mask tooling module configured to print the mask layout design;
a fabrication module configured to fabricate the IC using the mask,
wherein the labels correspond to a probability of whether the corrected IC design will print-out successfully on a wafer or print with defects on the wafer.

11. The system of claim 10, further comprising:
a data training module configured to generate the database by:
  generating a plurality of IC design layouts, and
  simulating each of the plurality of IC design layouts to determine a probability of whether the corrected IC design will print-out successfully on a wafer or print with defects on the wafer.

12. The system of claim 11, wherein the data training module is further configured by:
  storing a label associated with each of the simulated IC design layouts in the database, wherein the label indicates the probability of whether the corrected IC design will print-out successfully on a wafer or print with defects on the wafer.

13. The system of claim 12, wherein the data preparation module is further configured to:
  verify the corrected IC design layout using a compact OPC model by performing a plurality of printing simulations for each IC at a plurality of exposure doses to determine the probability of whether the corrected IC design will print-out successfully on a wafer or print with defects on the wafer.

14. The system of claim 10, wherein receiving the IC design layout comprises receiving a graphic design system (GDS) file, and wherein the corrected IC design layout comprises an adjusted GDS file.

15. The system of claim 10, wherein the machine learning algorithm comprises at least one of: a convolutional neural network algorithm, a recursive neural network algorithm, a support vector machine algorithm, or a deep learning artificial intelligence algorithm.

16. A computer readable medium having computer executable code stored thereon, comprising:
  code for receiving an integrated circuit (IC) design layout;
  code for performing an optical proximity correction (OPC) process to the IC design layout to produce a corrected IC design layout;
  code for verifying the corrected IC design layout, wherein the code for verifying the corrected IC design layout comprises code for using a machine learning algorithm to identify and compare one or more features of the corrected IC design layout with the database comprising a plurality of features; and
  code for generating a database, comprising:
    code for generating a plurality of IC design layouts,
    code for simulating each of the plurality of IC design layouts to determine a probability of whether the corrected IC design will print-out successfully on a wafer or print with defects on the wafer, and code for storing a label associated with each of the simulated IC design layouts in the database, wherein the label indicates the probability of whether the corrected IC design will print-out successfully on a wafer or print with defects on the wafer.

17. The computer readable medium of claim 16, further comprising:

code for verifying the corrected IC design layout based on labels in the database associated with the plurality of features.

18. The computer readable medium of claim 16, wherein the labels correspond to a probability of whether the corrected IC design will print-out successfully on a wafer or print with defects on the wafer.

19. The computer readable medium of claim 16, wherein code for receiving the IC design layout comprises code for receiving a graphic design system (GDS) file, and wherein the corrected IC design layout comprises an adjusted GDS file.

20. The computer readable medium of claim 16, wherein the machine learning algorithm comprises at least one of: a convolutional neural network algorithm, a recursive neural network algorithm, a support vector machine algorithm, or a deep learning artificial intelligence algorithm.

\* \* \* \* \*